Figure 1:
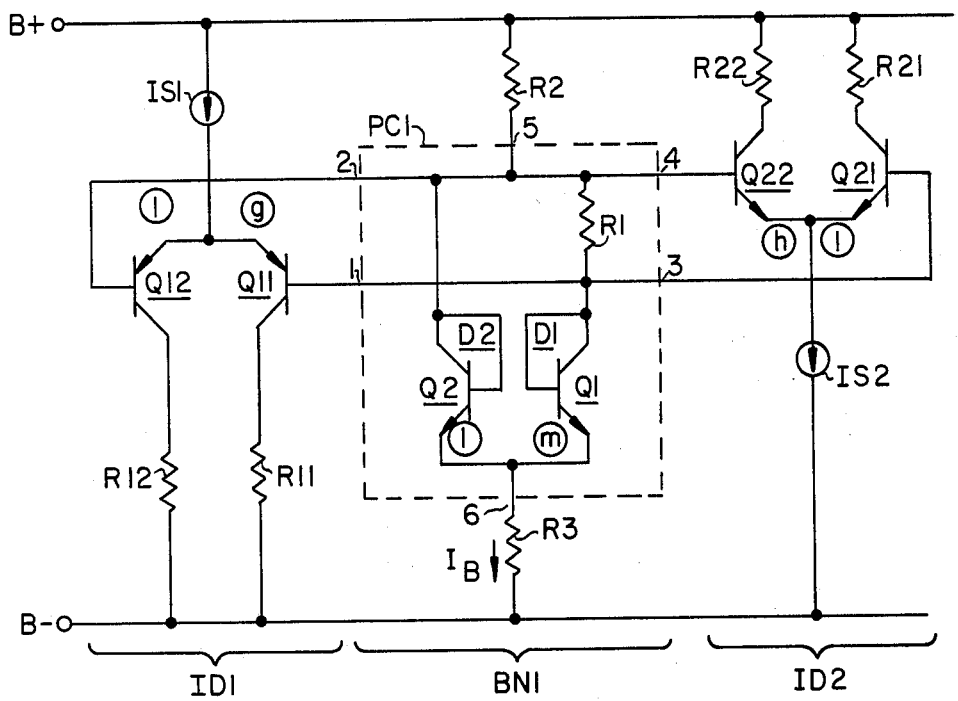

United States Patent [19]
Ahmed

[11] 4,284,945
[45] Aug. 18, 1981

[54] CURRENT DIVIDERS USING EMITTER-COUPLED TRANSISTOR PAIRS

[75] Inventor: Adel A. A. Ahmed, Clinton Township, Hunderdon County, N.J.

[73] Assignee: RCA Corporation, New York, N.Y.

[21] Appl. No.: 128,872

[22] Filed: Mar. 10, 1980

Related U.S. Application Data

[62] Division of Ser. No. 973,457, Dec. 26, 1978.

[51] Int. Cl.$^3$ .............................................. G05F 3/20
[52] U.S. Cl. ..................................... 323/315; 307/297
[58] Field of Search .................... 307/296, 297; 323/1, 323/4, 9

[56] References Cited

U.S. PATENT DOCUMENTS

| | | |
|---|---|---|
| 3,766,543 | 10/1973 | Te Winkel et al. |
| 3,867,685 | 2/1973 | Ahmed . |
| 3,921,091 | 11/1975 | Van Kessel et al. |
| 3,943,431 | 3/1976 | Hareyama . |
| 4,021,722 | 5/1977 | Crowle . |
| 4,025,842 | 5/1977 | Crowle . |
| 4,045,694 | 8/1977 | Ahmed . |
| 4,051,428 | 9/1977 | Imai . |

OTHER PUBLICATIONS

"A precision Active Current-Splitting Circuit Technique," R. W. J. Barker & B. L. Hart, *IEEE Journal of Solid State Circuits*, Jun. 1976, pp. 406-408.

*Primary Examiner*—William M. Shoop
*Attorney, Agent, or Firm*—E. M. Whitacre; P. J. Rasmussen; Allen LeRoy Limberg

[57] ABSTRACT

A current divider apportions current applied to the interconnected emitters of a pair of current-dividing transistors as their respective emitter currents in a ratio dependent upon the voltage applied between their bases. A first diode means and a resistor are connected in a series connection, which series connection is in parallel connection with a second diode means. Current is applied to this parallel connection in a poling to forward-bias the first and second diode means which exhibit a difference in offset potentials across said resistor. A voltage directly related to this difference is applied between the bases of the pair of current-dividing transistors to determine the ratio of their emitter currents.

9 Claims, 10 Drawing Figures

CURRENT DIVIDERS USING EMITTER-COUPLED TRANSISTOR PAIRS

The present application is a division of U.S. Pat. application Ser. No. 973,457 filed 26 Dec. 1978, incorporated herein by reference for showing the utility of the current dividers herein described.

The present invention relates to current dividers using emitter-coupled transistor pairs and more particularly, to the biasing of such transistor pairs.

Brian Crowle in U.S. Pat. No. 4,025,842 issued May 24, 1977 and entitled "CURRENT DIVIDER PROVIDED TEMPERATURE-DEPENDENT BIAS POTENTIAL FROM CURRENT REGULATOR" describes the biasing of such transistor pairs from current regulators formed by the regenerative loop connection of two current amplifiers, at least one of which exhibits decreasing current gain which increased input current. The present invention is directed to the biasing of emitter-coupled pairs without need for a regenerative loop connection of current amplifiers, which arrangement tends to be more complex than one would desire, particularly in monolithic integrated circuits where one desires to be economical in the number of components that take up area on the monolithic die or "chip". Avoiding the need for regenerative loop connection of current amplifiers also eliminates any uncertainties concerning whether regeneration will establish itself as desired—i.e., whether the loop will undesirably tend towards self-oscillation.

At the same time somewhat simpler current divider structures are sought than emitter-coupled pairs biased from forward-biased diode strings as described in the present inventor's earlier U.S. Pat. No. 3,867,685 issued Feb. 18, 1975 and entitled "FRACTIONAL CURRENT SUPPLY."

The present invention is embodied in circuitry in which the voltage used to differentially bias the base electrodes of an emitter-coupled pair of current-dividing transistors is direct related to that developed across a resistor connected as follows. The resistor is in a series connection with a first diode means, which series connection is in parallel connection with a second diode means. This parallel connection has a bias current applied to it of such poling as to forward bias the first and second diode means.

Figure 2:
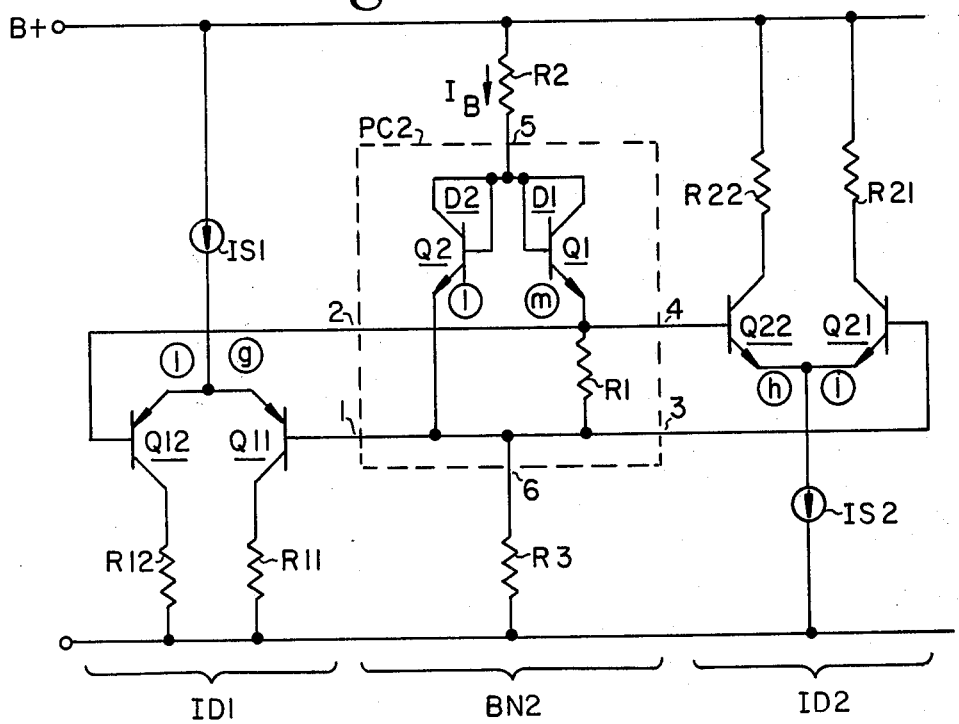
Figure 8:
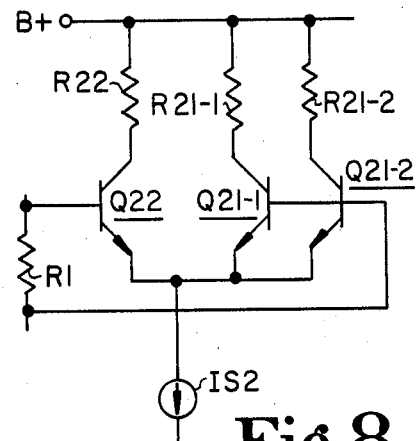
Figure 9:
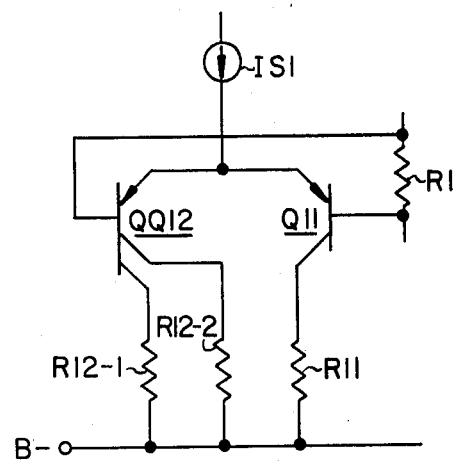
Figure 10:
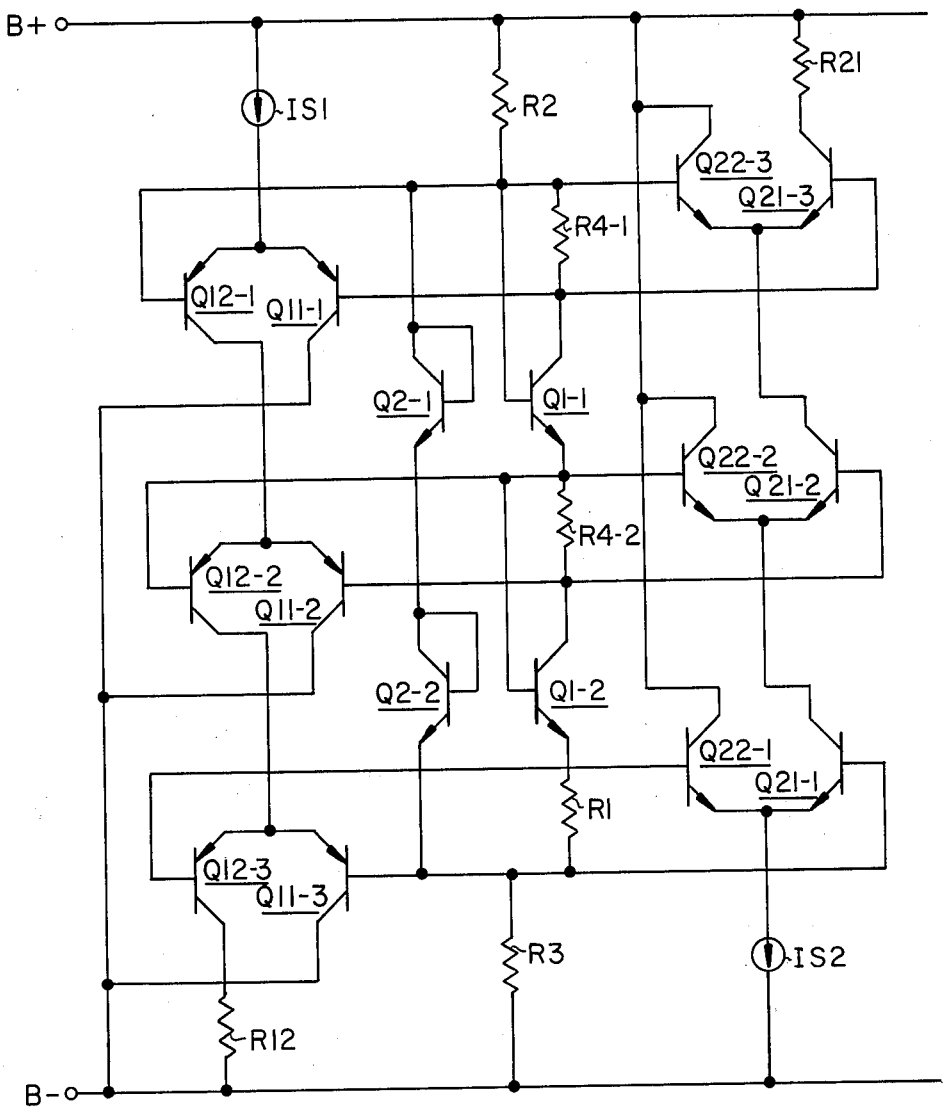

In the drawing:

each of FIGS. 1 and 2 is a schematic diagram of a pair of current dividers, each embodying the present invention;

each of FIGS. 3, 4, 5, 6 and 7 is a schematic diagram of a modification to be made to the biasing networks for the FIG. 1 or FIG. 2 current dividers to generate further embodiments of the present invention;

FIGS. 8 and 9 are schematic diagrams of modifications that can be made to the current dividers of FIGS. 1 and 2; and FIG. 10 is a schematic diagram of a pair of current dividers, each employing cascaded emitter-coupled pairs and embodying the present invention.

In both FIGS. 1 and 2 a single bias network BN1 or BN2, is shown being used for biasing two current dividers, although in actual practice a bias network will customarily be used with only a single current divider. The first ID1 of these current dividers comprises emitter-coupled PNP transistors Q11 and Q12 for dividing a positive current, which though unidirectional may exhibit signal current variations, supplied their interconnected emitters from current generator IS1. The divided portions of this current are supplied from the collector electrodes of Q11 and Q12 to, by way of example, respective collector load resistors R11 and R12. The second ID2 of these current dividers divides the unidirectional current demand presented by current generator IS2 to the interconnected emitters of NPN transistors Q21 and Q22 to allocate portions of this demand to collector load resistors R21 and R22.

The relative conductances that would be exhibited by Q11 and Q12 between collector and emitter for similar emitter-to-base voltages ($V_{BE}$'s) would be in g:1 ratio, as indicated by the encircled "g" and "1" near their respective emitter electrodes. The respective conductances that would be exhibited by Q21 and Q22 between collector and emitter for similar $V_{BE}$'s would be in 1:h ratio, as indicated by the encircled "1" and "h" near their respective emitter electrodes. The factors g and h customarily will equal or exceed unity. By derivation from a well-known equation describing transistor action as shown in the patents cited above, it is known that the respective collector currents $I_{C-Q12}$ and $I_{C-Q11}$ of Q12 and Q11 will be in the following ratio dependent upon the voltage difference $\Delta V_{BE}$ between their respective emitter-to-base voltages $V_{BE-Q12}$ and $V_{BE-Q11}$.

$$I_{C-Q12}/I_{C-Q11} = (1/g) \exp(q\Delta V_{BE}/kT) \qquad (1)$$

where q is the charge on an electron, k is Boltzmann's constant, and

T is the absolute temperature at which Q11 and Q12 are operated.

Similarly the ratio of the respective collector currents $I_{C-Q21}$ and $I_{C-Q22}$ of Q21 and Q22 are known to be in the following ratio dependent upon the voltage difference $\Delta V_{BE}$ between their respective emitter-to-base voltages $V_{BE-Q21}$ and $V_{BE-Q22}$.

$$I_{C-Q21}/I_{C-Q22} = (1/h) \exp(q\Delta V_{BE}/kT) \qquad (2)$$

wherein T is the absolute temperature at which Q21 and Q22 are operated. To get a substantially temperature-independent division of current in either of the current dividers ID1 and ID2 it is desirable, then, to develop a $\Delta V_{BE}$ substantially linearly dependent upon temperature.

In both FIGS. 1 and 2 NPN transistors Q1 and Q2 are provided respective collector-to-base feedback, each by direct connection of its collector and base electrodes, connecting them to function respectively as a first semiconductor diode means D1 and a second semiconductor diode means D2. Q1 would exhibit a collector-to-emitter conductance m times that of Q2 were they to have equal respective emitter-to-base voltages $V_{BE-Q1}$ and $V_{BE-Q21}$, m being a factor larger than unity, as indicated by the encircled "m" and "1" near their respective emitter electrodes. Diode means D1 is in series connection with a resistor R1, which series connection is in parallel connection with diode means D2. FIGS. 1 and 2 show respective ones of the canonic forms the parallel connections can take, the respective parallel connections PC1 and PC2 of bias networks BN1 and BN2 differing in the order that D1 and R1 are arranged in their component series connections.

In each figure the voltage drop across R1 is applied between the bases of Q11 and Q12 via connections 1 and 2 and between the bases of Q21 and Q22 via connections 3 and 4. It is assumed that customarily the impedance levels of the elements in bias network BN1 or BN2 will be appreciably lower than the base impedances offered by Q11, Q12, Q21 and Q22 so the effects of the base currents of these transistors is negligible. Modifications of design practice to accommodate base current errors can, of course, be made by one skilled in the art and armed with this disclosure.

A bias current $I_B$ is caused to flow between connections 5 and 6 at the ends of parallel connection PC1 in FIG. 1 or PC2 in FIG. 2. This bias current $I_B$ is of a polarity to forward-bias each of the diode means D1 and D2, and an offset voltage equal to $V_{BE-Q2}$ appears between connections 6 and 5 responsive to $I_B$. One means of providing this bias current is provided as shown in FIGS. 1 and 2, by connecting a resistor R2 of resistance $R_2$ between connection 5 and terminal B+ for receiving a relatively positive operating voltage $V_{B+}$ and by connecting a resistor R3 of resistance $R_3$ between connection 6 and terminal B− for receiving a relatively negative operating voltage $V_{B-}$. This results in accordance with Ohm's Law in the following value for the bias current $I_B$.

$$I_B = (V_{B+} - V_{B-} - V_{BE-Q2})/(R_2 + R_3) \qquad (3)$$

Connection 5 will be offset from $V_{B+}$ by a voltage $I_B R_2$, and connection 6 will be offset from $V_{B-}$ by a voltage $I_B R_3$. The ratio of $R_2$ and $R_3$ can be varied to bias the base electrodes of the current-dividing transistors Q11, Q12 and Q21, Q22 wherever desired between $V_{B-}$ and $V_{B+}$ voltages.

The value of the $\Delta V_{BE}$ voltage developed across resistor R1 as the difference of $V_{BE-Q2}$ and $V_{BE-Q1}$ depends upon the apportionment of bias current $I_B$ between the branch of the parallel connection containing diode means D2 and the branch containing the series connection of diode means D1 and R1. This can be appreciated by derivation from the following well-known equation describing transistor action.

$$V_{BE} = (kT/q) \ln(I_E/AJ_s) \qquad (4)$$

wherein $V_{BE}$ is the emitter-to-base voltage of the transistor, $I_E$ is the emitter current of the transistor, A is the effective area of the transistor emitter-base junction, each of which quantities will carry as a subscript the identification alphanumeric of the transistor with which it is associated, and $J_S$ is the value of $I_E 1 A$ when $V_{BE}=0$, which like T is assumed to be the same for all transistors of similar conductivity type proximately located in the same monolithic integrated circuit.

$$V_{BE-Q1} = (kT/q) \ln(I_{E-Q1}/A_{Q1}J_s) \qquad (5)$$

$$V_{BE-Q2} = (kT/q) \ln(I_{E-Q2}/A_{Q2}J_s) \qquad (6)$$

$$\Delta V_{BE} = V_{BE-Q2} - V_{BE-Q1} \qquad (7)$$
$$= (kT/q)\ln(I_{E-Q2}A_{Q1}/I_{E-Q1}A_{Q2})$$
$$= (kT/q)\ln(m\, I_{E-Q1}/I_{E-Q1})$$

The ratio $A_{Q1}/A_{Q2}$ defines the ratio m of the relative collector-to-emitter conductances of Q1 and Q2 for equal $V_{BE}$'s as can be seen from equation 4, and this allows the last step in the foregoing derivation.

In the design procedure, one starts knowing the apportionment desired of the current supplied from current generator IS1 to the emitters of Q11 and Q12, or the apportionment desired of the current supplied to current generator IS2 from the emitters of Q21 and Q22. From this the desired $\Delta V_{BE}$ is known. (Note that in circuits using both current dividers CD1 and CD2, the current division ratios in dividers CD1 and CD2 can be different for the same $V_{BE}$ by choosing different values of g and h.) One generally selects a sufficiently large value of $I_B$ to render the base current demands of the current dividing transistors negligible by comparison and designs the network to supply $I_B$. One decides upon an apportionment of $I_B$ between the two branches of the parallel connection PC1 or PC2. Knowing the $\Delta V_{BE}$ that must appear across R1, and knowing the decided-on value of the portion of $I_B$ to flow as $I_{E-Q1}$ through the series connection of R1 and D1, one calculates the resistance $R_1$ of resistor R1.

This calculation is made according to the following formulation of Ohm'Law $$R_1 = \Delta V_{BE}/I_{E-Q1} \qquad (8)$$

Finally, knowing $\Delta V_{BE}$ and the decided-on values of $I_{E-Q1}$ and $I_{D-Q2}$, one calculates the factor m from equation 7.

The ratio $I_{E-Q2}/I_{E-Q1}$ does not remain fixed if $I_B$ changes. It can be shown that $I_{E-Q1}$ changes approximately logarithmically with change in $I_B$, so $V_{BE}$ changes approximately logarithmically with $I_B$. This means the respective current division ratios $I_{C-Q12}/I_{C-Q11}$ and $I_{C-Q21}/I_{C-Q22}$ of current dividers CD1 and CD2 vary substantially linearly with $I_B$. Accordingly, the current division in current divider CD1 and CD2 can be trimmed by making R2 or R3 to have an adjustable resistance.

Figure 3:
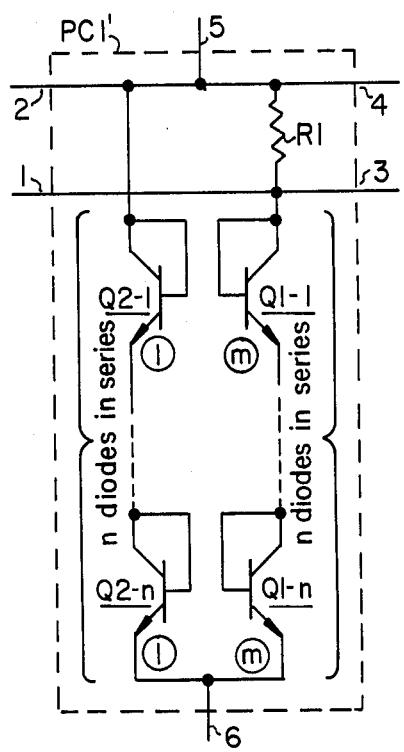
Figure 4:
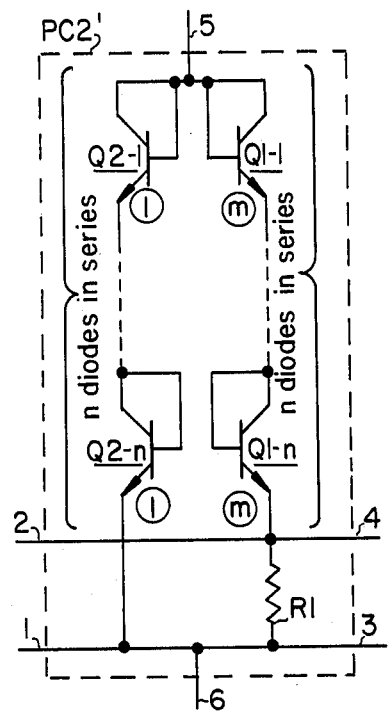
Figure 5:
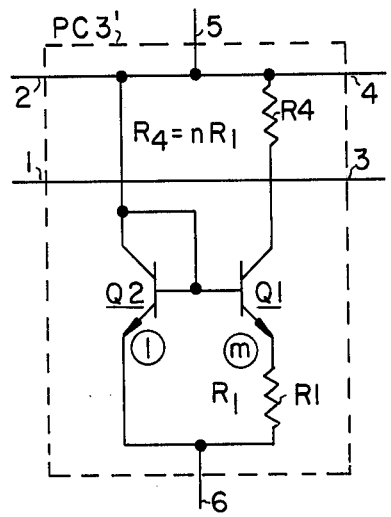
Figure 6:
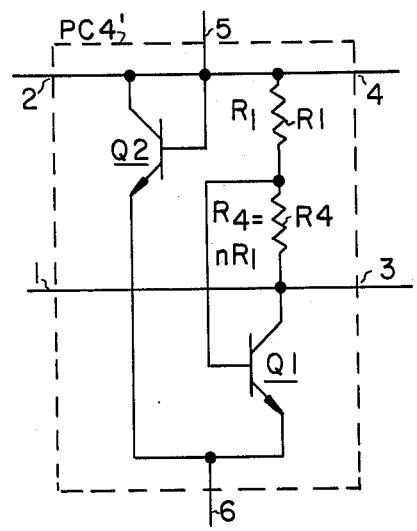

FIGS. 3 and 4 show parallel connections PC1' and PC2' that are modifications of parallel connections PC1 and PC2, respectively, made by replacing the diode-connected NPN transistor Q1 forming diode means D1 with the series connection of a plurality n in number of similar diode-connected NPN transistors Q1−1, . . . Q1−n, and by replacing the diode-connected NPN transistor Q2 forming diode means P2 with the series-connection of a plurality n in number of similar diode-connected transistors Q2−1, . . . Q2−n, PC1' and PC2' provide $\Delta V_{BE}$'s n times as large as those of PC1 and PC2 for same values of $R_1$ and $I_B$ and same apportionment of $I_B$ between the branches of the parallel connection. FIG. 5 shows another parallel connection PC3 to be used instead of PC1 and PC2 providing a $\Delta V_{BE}$ n times as large for the same values of $R_1$ and $I_B$ and same apportionment of $I_B$ between the branches of the parallel connection. This larger $\Delta V_{BE}$ appears across a collector resistor R4 having a resistance $R_4 = nR_1$ included between the base and collector electrodes of Q1, and n may be made non-integral in value. FIG. 6 shows still another parallel connection PC4 showing how rearrangement of the series connection in the right branch of PC3 can provide a $\Delta V_{BE}(n+1)$ times as large for the same values of $R_1$, $R_4$ and $I_B$ and same apportionment of $I_B$ between the branches of the parallel connection.

Bias networks BN1 and BN2 may be modified in many ways respective to the way in which bias current $I_B$ is generated. E.g., where intermediate supply voltages are available connections 5 or 6 may be to such voltages rather than to B+ or ground through a resistor. E.g., either R2 or R3 might be replaced by a constant current generator.

Figure 7:
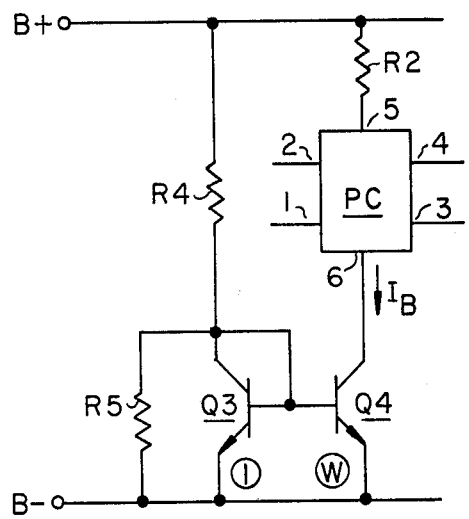

FIG. 7 is illustrative of this second type of modification, R2 being replaced by a current generator comprising NPN transistors Q3 and Q4 connected in a current mirror amplifier configuration having a current gain of $-w$ as defined by the relative collector-to-emitter conductances of Q4 and Q3. The input current to the current mirror amplifier is defined by the $(V_{B+} - V_{B-} - V_{BE-Q3})/R_4$ current flowing to its input connection from terminal B+ via resistor R4 with resitance R4 in accordance with Ohm's Law, less the $V_{BE-Q3}/R_5$ current flowing from its input connection to terminal B— via resistor R5 with resistance R5. The ratio of resistances R2, R4 and R5 can be chosen to place connection 5 or 6 at a desired voltage between $V_{B-}$ and $V_{B+}$.

Current divider CD1 may be modified as taught by FIG. 8 to replace Q21 and its collector load with a plurality of NPN transistors—e.g., Q21−1 and Q21−2 with parallelly connected emitter-base junctions and respective collector loads, e.g., resistors R21-1 and R21-2. The relative strengths of the collector currents of Q21-1 and Q21-2 will be determined by the respective ratios of their effective emitter-base junction areas so that of Q22, presuming them to be conventional vertical-structure integrated transistors.

Similarly, current divider CD2 may be modified as taught by FIG. 9 replacing Q12 and its collector load R12 with a plural-collector PNP transistor—e.g., QQ12— and respective collector load resistors—e.g., R12-1 and R12-2. The relative strengths of the collector currents will be determined by the respective collection efficiencies to each collector, presuming QQ12 to a conventional lateral-structure integrated transistor.

FIG. 10 illustrates how cascaded current divider pairs Q21-1, Q22-1; Q21-2, Q22-2; Q21-3, Q22-3; Q11-1, Q12-1; Q11-2, Q12-2; and Q11-3, Q12-3 can be biased according to the present invention. NPN transistors Q1-1 and Q1-2 are provided with respective collector resistors R4-1 and R4-2 included between their collector and base electrodes for developing voltages thereacross proportional to the $\Delta V_{BE}$ developed across resistor R1. Cascaded current division allows division by very large factors. This is useful, for example, in applying current feedback to high gain current amplification.

What is claimed is:

1. A current divider comprising:
    a first terminal for conducting the current to be divided;
    second and third terminals for conducting respective portions of the divided current;
    first and second transistors of a first conductivity type having respective emitter electrodes connected to said first terminal, having respective collector electrodes connected to said second terminal and to said third terminal, and having respective base electrodes;
    a first resistance;
    first and second semiconductor diode means, said first diode means exhibiting a smaller offset voltage thereacross for given flow of current therethrough than said second diode means, said first diode means and said first resistance being in a first series connection, said second diode means in parallel connection with said first series connection;
    means for applying a bias current to said parallel connection for forward biasing said first and second diode means; and
    means for applying voltage between the base electrodes of said first and second transistors that is directly related to the resulting voltage appearing across said first resistance.

2. A current divider as set forth in claim 1 wherein said means for applying a bias current to said parallel connection includes:
    second and third resistances with respective first ends between which said parallel connection is connected and with respective second ends; and
    means for applying an operating voltage between the second ends of said second and third resistances of a poling to forward-bias said first and second diode means in said parallel connection.

3. A current divider as set forth in claim 1 or 2 wherein said first resistance has one end connected at the base electrode of said first transistor and has its other end connected at the base electrode of said second transistor, wherein said first diode means consists of a third transistor of a second conductivity type complementary to said first conductivity type having collector and base electrodes connected at the base electrode of said first transistor and having an emitter electrode, and wherein said second diode means consists of a fourth transistor of said second conductivity type having base and collector electrodes connected at the base electrode of said second transistor and having an emitter electrode interconnected with the emitter electrode of said third transistor.

4. A current divider as set forth in claim 1 or 2 wherein said first resistance has one end connected at the base electrode of said first transistor and has its other end connected at the base electrode of said second transistor, wherein said first diode means consists of a third transistor of said first conductivity type having collector and base electrodes connected at the base electrode of said first transistor and having an emitter electrode, and wherein said second diode means consists of a fourth transistor of said first conductivity type having base and collector electrodes connected at the base electrode of said second transistor and having an emitter electrode interconnected with the emitter electrode of said third transistor.

5. A current divider as set forth in claim 1 or 2 wherein said first resistance has one end connected at the base electrode of said first transistor and has its other end connected at the base electrode of said second transistor, wherein said first diode means consists of a third transistor of a second conductivity type complementary to said first conductivity type having an emitter electrode connected at the base electrode of said first transistor and having interconnected base and collector electrodes, and wherein said second diode means consists of a fourth transistor of said second conductivity type having an emitter electrode connected at the base electrode of said second transistor and having interconnected base and collector electrodes sharing a point of interconnection with the interconnected base and collector electrodes of said third transistor.

6. A current divider as set forth in claim 1 or 2 wherein said first resistance has one end connected at the base electrode of said first transistor and has its other end connected at the base electrode of said second transistor, wherein said first diode means consists of a third transistor of said first conductivity type having an emitter electrode connected at the base electrode of said first transistor and having interconnected base and collector electrodes, and wherein said second diode means consists of a fourth transistor of said first conductivity type having an emitter electrode connected at the base electrode of said second transistor and having interconnected base and collector electrodes sharing a point of interconnection with the interconnected base and collector electrodes of said third transistor.

7. A current divider as set forth in claim 1 or 2 including an even-numbered plurality of further semiconductor diode means, half each exhibiting offset voltage across itself similar to that exhibited by said first diode means for the same flow of current therethrough and being included in such first series connection serially connected with said first diode means, and the other half each exhibiting offset voltage across itself similar to that exhibited by said second diode means for the same flow of current therethrough and being in a second series connection with said second diode means within the parallel connection with said first series connection.

8. A current divider as set forth in claim 1 or 2 having third and fourth transistors of like conductivity type having respective collector electrodes respectively connected to the base electrode of said first transistor and to the base electrode of said second transistor, having respective base electrodes connected to the base electrode of said second transistor, and having respective emitter electrodes between which said first resistance is connected; and a further resistance connected at one end to the base electrode of said first transistor and at its other end to the base electrode of said second transistor, the foregoing connections of said third transistor and said further resistance operating them as said first diode means, and the foregoing connections of said fourth transistor operating it as said second diode means.

9. A current divider as set forth in claim 1 or 2 having:
a further resistance in series connection with said first resistor between the base electrodes of said first and second transistors;
a third transistor having base and collector electrodes connected to the respective ends of said further resistance relatively closer to and further from said first resistance in said series connection of first and further resistances, having an emitter electrode, and cooperating with said further resistance to essentially provide said first semiconductor diode means; and
a fourth transistor of the same conductivity type as said third transistor having base and collector electrodes connected to the end of said first resistance remote from said further resistance in said series connection of first and further resistances, having an emitter electrode connected to the emitter electrode of said third transistor, and serving in such connection to essentially provide said second semiconductor means.

* * * * *

UNITED STATES PATENT AND TRADEMARK OFFICE
CERTIFICATE OF CORRECTION

PATENT NO. : 4,284,945
DATED : August 18, 1981
INVENTOR(S) : A. A. A. Ahmed

It is certified that error appears in the above—identified patent and that said Letters Patent is hereby corrected as shown below:

| | |
|---|---|
| Column 1, Line 5 | after "division" insert -- and continuation-in-part -- ; |
| Column 4, Line 23 | "Ohm'Law" should be -- Ohm's Law -- ; |
| Column 4, Lines 34 & 35 | "$I_{C-Q1-2}/I_{C-Q11}$" should read -- $I_{C-Q12}/I_{C-Q11}$ -- ; and |
| Column 5, Line 27 | "so" should be -- to -- . |

Signed and Sealed this

Sixteenth Day of February 1982

[SEAL]

Attest:

GERALD J. MOSSINGHOFF

*Attesting Officer*   *Commissioner of Patents and Trademarks*